(12) United States Patent
Lai (10) Patent No.: US 8,430,527 B2
(45) Date of Patent: Apr. 30, 2013

(54) ILLUMINATING DEVICE AND METHOD FOR MANUFACTURING THE SAME

(75) Inventor: Kuang-Chu Lai, Shulin (TW)

(73) Assignee: Liang Meng Plastic Share Co., Ltd., New Taipei (TW)

( * ) Notice: Subject to any disclaimer, the term of this patent is extended or adjusted under 35 U.S.C. 154(b) by 394 days.

(21) Appl. No.: 12/791,030

(22) Filed: Jun. 1, 2010

(65) Prior Publication Data

US 2011/0075421 A1    Mar. 31, 2011

(30) Foreign Application Priority Data

Sep. 29, 2009   (TW) ............................... 98133054 A (51) Int. Cl.
*F21V 5/04* (2006.01)
*F21V 5/00* (2006.01)

(52) U.S. Cl.
USPC ................. 362/244; 362/311.02; 362/311.15; 362/249.02; 362/294; 362/373

(58) Field of Classification Search ............ 362/311.02, 362/311.14, 311.15, 249.02, 294, 373, 331, 362/268, 311.06, 244, 240, 245, 246, 237, 362/238
See application file for complete search history.

(56) References Cited

U.S. PATENT DOCUMENTS

| | | | | |
|---|---|---|---|---|
| 3,875,456 | A * | 4/1975 | Kano et al. ................... | 313/501 |
| 6,345,903 | B1 * | 2/2002 | Koike et al. ................... | 362/241 |
| 7,494,245 | B2 * | 2/2009 | Chang .......................... | 362/245 |
| 7,775,685 | B2 * | 8/2010 | Loh .......................... | 362/311.02 |
| 7,976,194 | B2 * | 7/2011 | Wilcox et al. ................ | 362/268 |
| 2007/0030676 | A1 * | 2/2007 | Ichihara ...................... | 362/244 |
| 2008/0032142 | A1 * | 2/2008 | Tasumi et al. ................ | 428/447 |
| 2009/0296403 | A1 * | 12/2009 | Zhang et al. .................. | 362/294 |

FOREIGN PATENT DOCUMENTS

| | | | |
|---|---|---|---|
| CN | 101430052 A | | 5/2009 |
| CN | 101387372 A | | 3/2013 |
| JP | 2007-194675 | * | 8/2007 |
| TW | M340396 U | | 9/2008 |

OTHER PUBLICATIONS

European Search Report.
Taiwan Official Action issued on Dec. 22, 2012.

* cited by examiner

Primary Examiner — Bao Q Truong
(74) *Attorney, Agent, or Firm* — Chun-Ming Shih; HDLS IPR Services (57) ABSTRACT

A method for manufacturing an illuminating device includes steps of: forming an electrical conductive circuit on a metallic substrate, arranging light-emitting elements on the metallic substrate to be electrically connected with the electrical conductive circuit, covering a transparent cap on each of the light-emitting elements, fixing an electrical connector to the metallic substrate to be electrically connected to the electrical conductive circuit, forming a transparent body outside the transparent caps, the metallic substrate and the electrical conductive circuit by means of an over-molding process; forming a lamp cover outside the transparent body, the metallic substrate and the electrical connector by means of an over-molding process. An illuminating device is further provided, thereby prevents the light-emitting elements from suffering damage due to the temperature and pressure of the over-molding process, and increasing the brightness of the light emitted by the light-emitting elements.

7 Claims, 12 Drawing Sheets

ILLUMINATING DEVICE AND METHOD FOR MANUFACTURING THE SAME

BACKGROUND OF THE INVENTION

1. Field of the Invention

The present invention relates to a device and a method for manufacturing the same, and in particular to an illuminating device and a method for manufacturing the same.

2. Description of Prior Art

Among light-emitting elements, since light-emitting diodes (LED) have advantages such as good brightness, long life and low electricity consumption, they have been widely used in the illuminating devices in the indoors and outdoors. The primary factors for determining the quality of the illuminating device are the degree of easiness in its manufacture, cost, life, optical loss, light-emitting efficiency, and heat-dissipating issue.

The conventional illuminating device includes a lamp cover, a light-emitting module, and a transparent lens. The transparent lens is fixed to one side of the lamp cover. An accommodating space is formed between the transparent glass and the lamp cover. The light-emitting module is mounted in the accommodating space, and it is constituted of a circuit board connected to the lamp cover and a plurality of LEDs arranged above the circuit board. The LEDs illuminate toward the transparent lens. In this way, a LED illuminating device can be formed. Further, the LED is constituted of a LED bare chip and a lens covering an outer surface of the LED bare chip.

However, in practice, the aforesaid illuminating device still has problems as follows. Since the light-emitting module is mounted in the accommodating space, and there is a great amount of gas in the accommodating space, the gas may affect the light emitted by the respective LEDs, so that the brightness of light projecting from the transparent lens will be reduced greatly. Further, since the temperature and pressure in the mold are very large when the LED bare chip is covered with a lens, the LED bare chip may often suffer damage. Further, since the electrical conductive circuit is exposed to the air, the electrical conductive circuit may be oxidized easily. Moreover, the lamp cover is often used to dissipate the heat generated by the respective LEDs. However, the area of the lamp cover contacting the LEDs is not so large enough that the heat generated by the LEDs cannot be dissipated rapidly.

Therefore, it is an important issue for the present Inventor to solve the above-mentioned problems.

SUMMARY OF THE INVENTION

The present invention is to provide an illuminating device and a method for manufacturing the same, whereby the damage of the light-emitting elements caused by the temperature and pressure in the mold during their formation can be prevented, and the brightness of light emitted by the light-emitting elements can be increased.

The present invention is to provide a method for manufacturing an illuminating device, including steps of:
 a) providing a metallic substrate;
 b) forming an electrical conductive circuit on a surface of the metallic substrate in an insulating manner;
 c) arranging at least one light-emitting element on the metallic substrate to be electrically connected with the electrical conductive circuit;
 d) covering a transparent cap on the at least one light-emitting element;
 e) providing an electrical connector and fixing the electrical connector to the metallic substrate so as to be electrically connected with the electrical conductive circuit;
 f) over-molding outside the transparent cap, the metallic substrate and the electrical conductive circuit to form a transparent body; and
 g) over-molding outside the transparent body, the metallic substrate and the electrical connector to form a lamp cover.

The present invention provides an illuminating device, including:
 a metallic substrate;
 at least one light-emitting element fixed on the metallic substrate;
 a transparent cap covering the at least one light-emitting element;
 a transparent body over-molded outside the metallic substrate and the transparent cap; and
 a lamp cover over-molded outside the metallic substrate and the transparent body.

In comparison with prior art, the present invention has advantageous features as follows. Since the transparent body is over-molded outside the electrical conductive circuit and the light-emitting elements, the electrical conductive circuit and the light-emitting elements may not be influenced easily by the humidity, moisture and temperature, which can extends their life. Further, the transparent body is formed with light-guiding posts or post-like lenses, the light emitted by the light-emitting elements can be controlled in a certain range accurately. Since the light-emitting elements, the transparent cap and the transparent body are adhered to each other tightly, there is no air layer in the interfaces of these elements, so that the brightness of light emitted by the light-emitting elements can be increased. As a result, the conventional surface mount technology (SMT) can be omitted, which reduces the production cost greatly. Further, a heat sink can be used to dissipate the heat generated by the light-emitting elements quickly.

DETAILED DESCRIPTION OF THE INVENTION

The characteristics and technical contents of the present invention will be explained with reference to the accompanying drawings. However, the drawings are illustrative only but not used to limit the present invention.

Please refer to FIGS. 1 to 8. The present invention provides a method for manufacturing an illuminating device, which includes the steps as follows.

Figure 1:
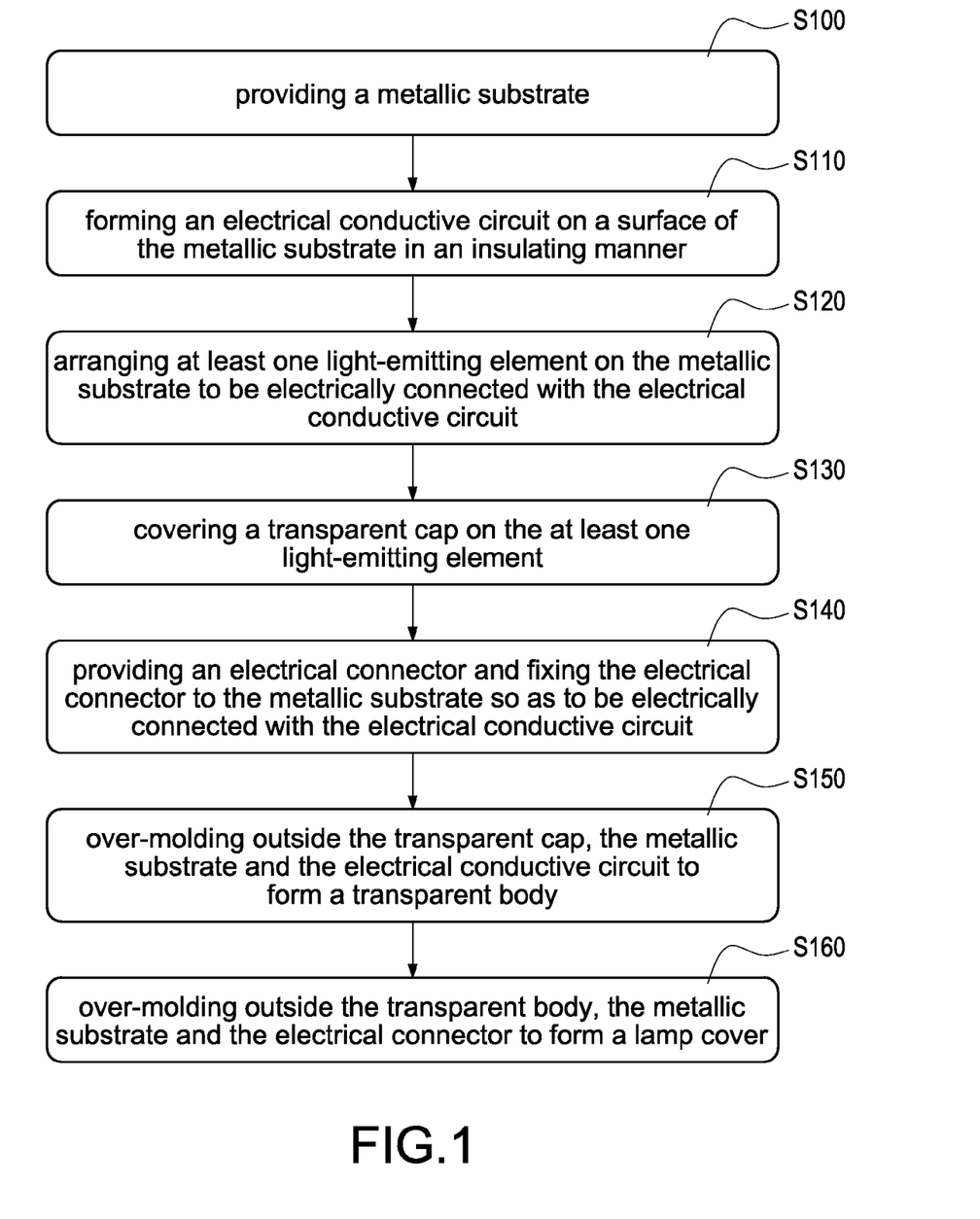
FIG. 1 is a flow chart showing the method of the present invention.
Figure 2:
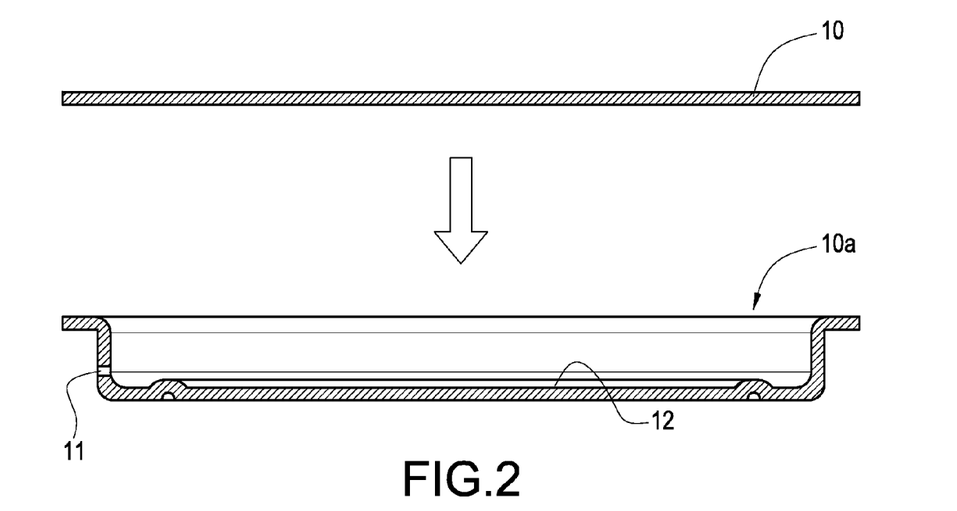
FIG. 2 is a cross-sectional view showing a metallic plate being formed into a three-dimensional casing according to the present invention.

In a step S100, a metallic substrate 10 is provided (FIG. 2). In this step, the metallic substrate 10 is a thin plate made of metallic materials having good extensibility and thermal conductivity such as aluminum, copper, aluminum alloy, copper alloy or the like. Then, a mold (not shown) prepared in advance is used to extend the metallic thin plate, thereby forming a three-dimensional plate 10a having a rectangular bottom plate and a plurality of surrounding plates extending upwards from each side of the bottom plate. One of the surrounding plates is provided with two through-holes 11.

Figure 3:
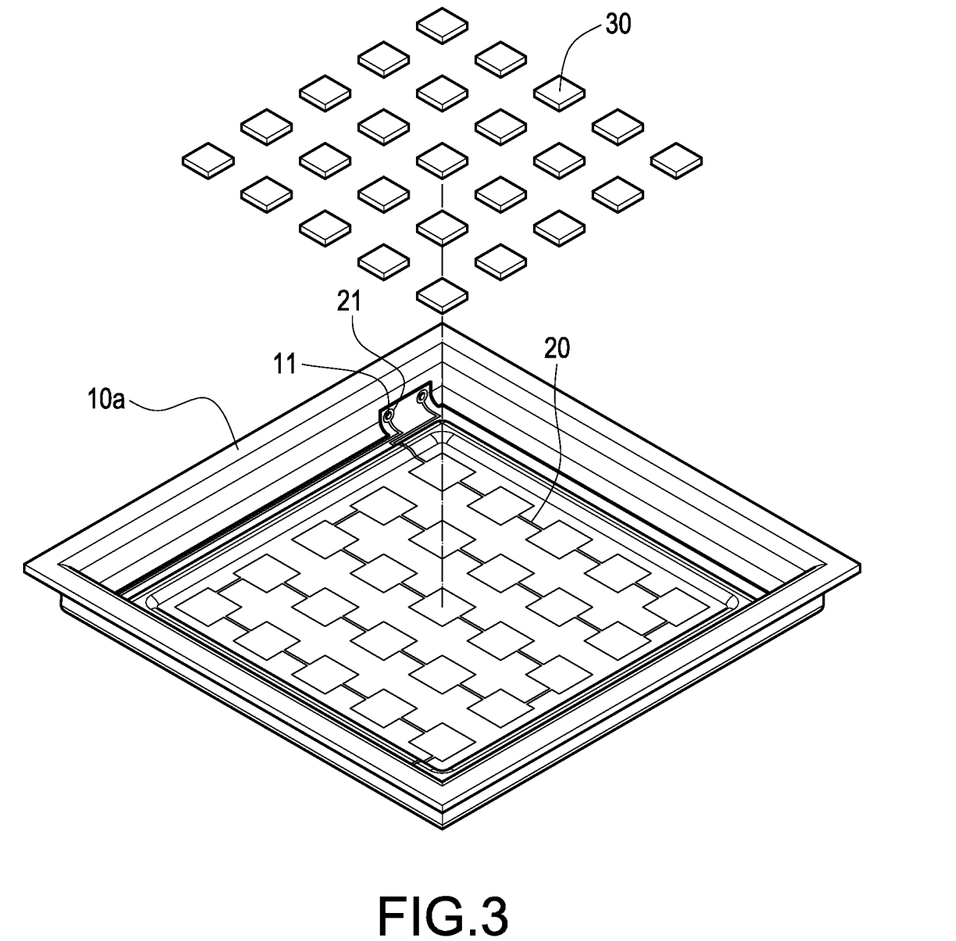
FIG. 3 is an exploded view showing the three-dimensional casing, a circuit and chips of the present invention.

In a step S110, an electrical conductive circuit 20 is formed on a surface 12 of the metallic substrate 10 in an insulating manner (FIG. 3). In this step, the electrical conductive circuit 20 is constituted of an insulating layer and a copper-clad circuit layer arranged above the insulating layer. The insulating layer is adhered to the inside surface 12 of the three-dimensional casing 10a of the metallic substrate 10. A pair of contacts 21 of the electrical conductive circuit 20 is provided to correspond to the through-holes 11 respectively.

Figure 4:
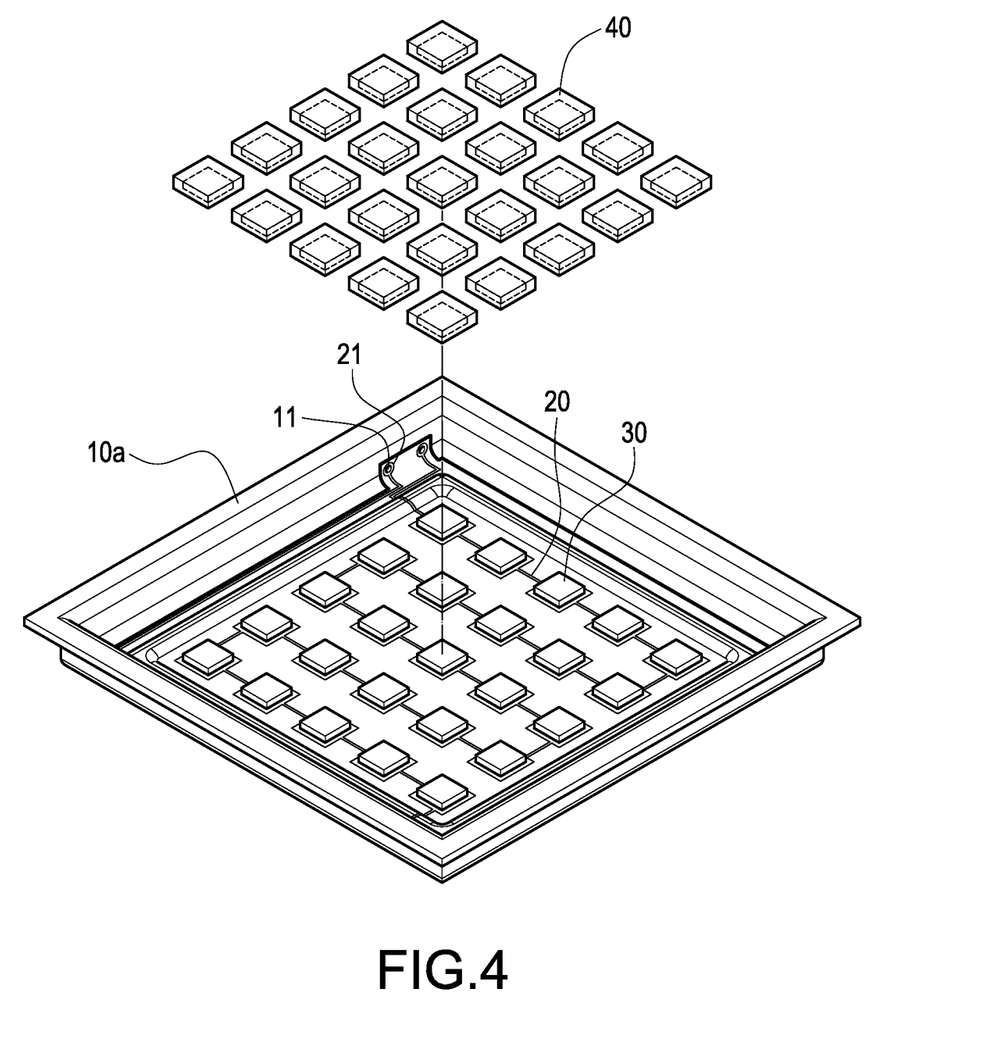
FIG. 4 is an exploded view showing the elements in FIG. 3 after assembly and transparent caps.

In a step S120, at least one light-emitting element 30 is arranged on the metallic substrate 10 to be electrically connected with the electrical conductive circuit 20 (FIG. 4). In this step, the inside of the three-dimensional casing 10a is coated with epoxy adhesive at positions in which the light-emitting elements 30 are to be disposed. Then, one or a plurality of light-emitting elements 30 is fixed to the predetermined positions inside the three-dimensional casing 10a. Further, the electrical conductive pins of each light-emitting element 30 are electrically connected onto the copper-clad circuit layer of the electrical conductive circuit 20. The light-emitting element 30 may be a LED bare chip or a LED packaged with a lens.

In a step S130, a transparent cap 40 covers the at least one light-emitting element 30 (FIG. 4). In this step, one or a plurality of transparent caps 40 covers each light-emitting element 30 correspondingly.

Figure 5:
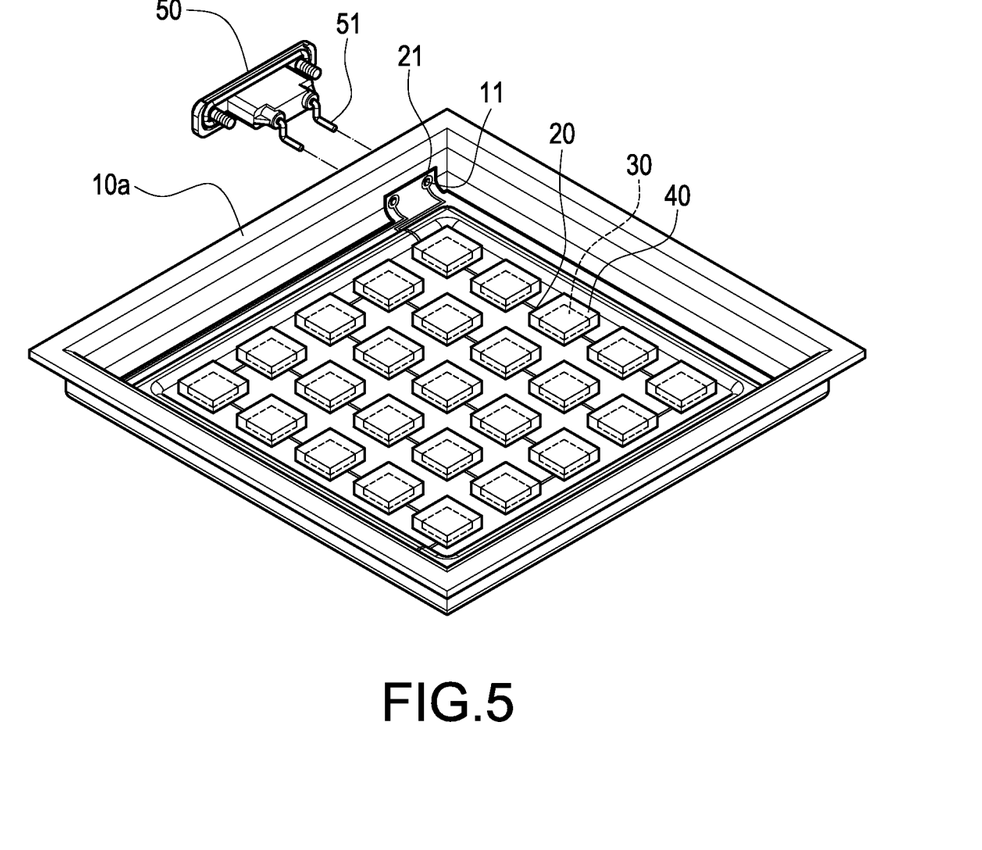
FIG. 5 is an exploded view showing the elements in FIG. 4 after assembly and an electrical connector.
Figure 6:
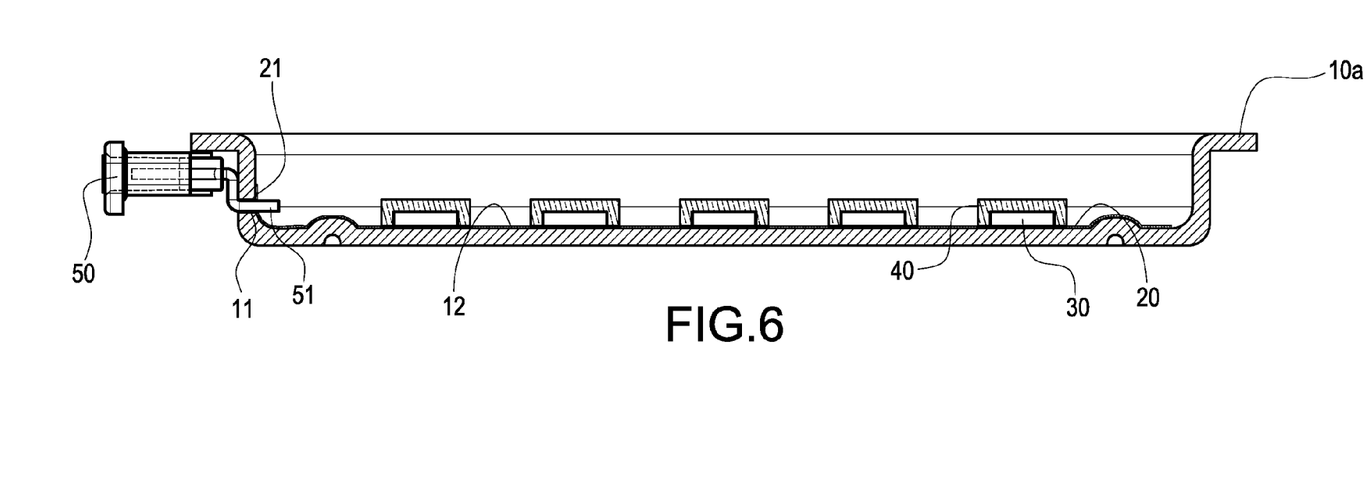
FIG. 6 is an assembled cross-sectional view showing the elements in FIG. 5 and the electrical connector.

In a step S140, an electrical connector 50 is provided. The electrical connector 50 is fixed to the metallic substrate 10 and electrically connected with the electrical conductive circuit 20 (FIGS. 5 and 6). In this step, a pair of electrical conductive rods 51 of the electrical connector 50 is inserted into the respective through-holes 11 of the three-dimensional casing 10a and electrically connected with the electrical conductive circuit 20. In the present embodiment, the electrical connector 50 is a socket.

Figure 7:
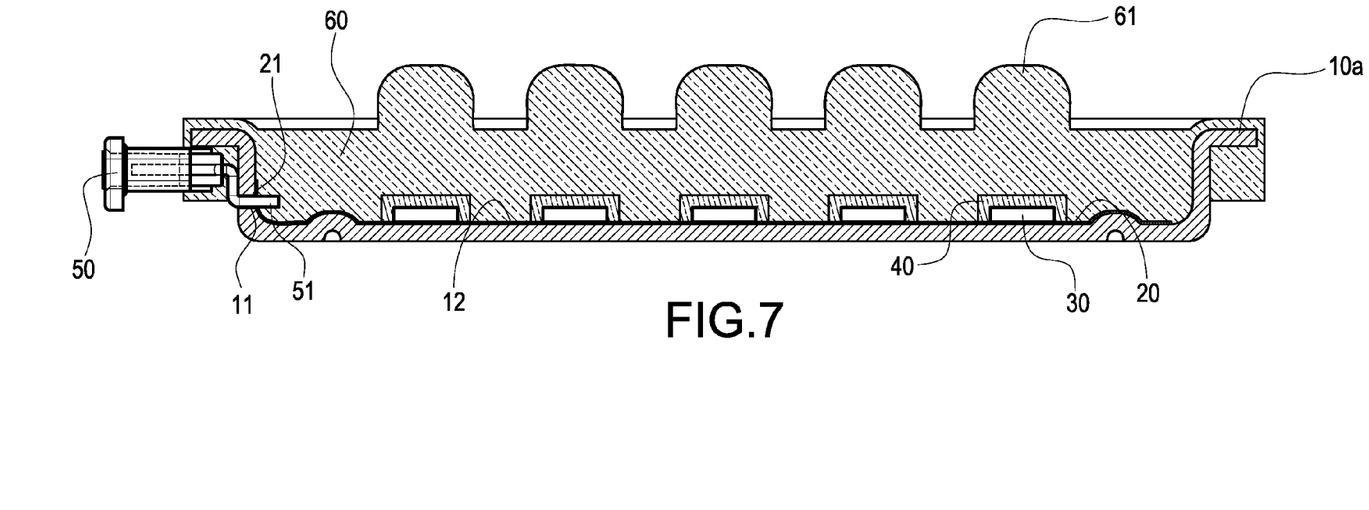
FIG. 7 is a cross-sectional view showing the elements of FIG. 6 and a transparent body after formation.

In a step S150, a transparent body 60 is over-molded outside the transparent cap 40, the metallic substrate 10 and the electrical conductive circuit 20 (FIG. 7). In this step, the semi-product manufactured in the step S140 is disposed in a mold (not shown). Then, epoxy, polycarbonate (PC) or other suitable materials are heated and melted. The molten material is injected into the mold to be over-molded outside the transparent cap 40, the electrical conductive circuit 20, and it partially over-molded outside the three-dimensional casing 10a and the electrical connector 50. After solidification, a transparent body 60 is formed and taken away from the mold. Further, in this step, a light-guiding post 61 is formed at a position corresponding to that of the transparent cap 40 and the light-emitting element 30.

Figure 8:
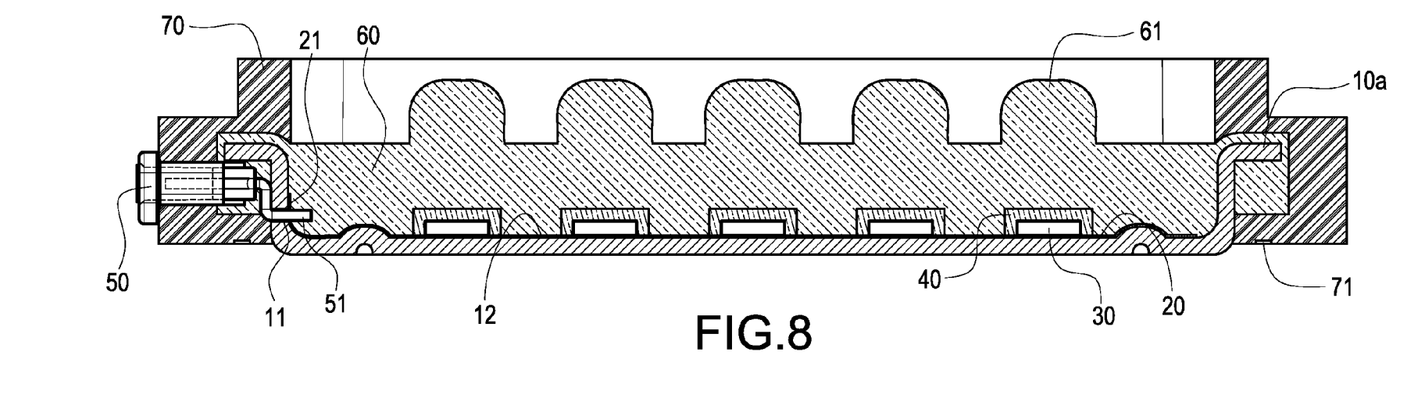
FIG. 8 is a cross-sectional view showing the elements of FIG. 7 and a lamp cover after formation.

In a step S160, a lamp cover 70 is over-molded outside the transparent body 60, the metallic substrate 10 and the electrical connector 50 (FIG. 8). In this step, the semi-product manufactured in the step S150 is disposed to a mold (not shown). Then, plastic materials are heated and melted. The molten plastic material is injected in the mold to be over-molded outside the transparent body 60, the three-dimensional casing 10a and the electrical connector 50. After solidification, a lamp cover 70 is formed and taken away from the mold. Further, in this step, an outer surface of the lamp cover 70 is formed with an insertion slot 71 that is provided at an outer periphery of the bottom plate of the three-dimensional casing 10a.

Figure 9:
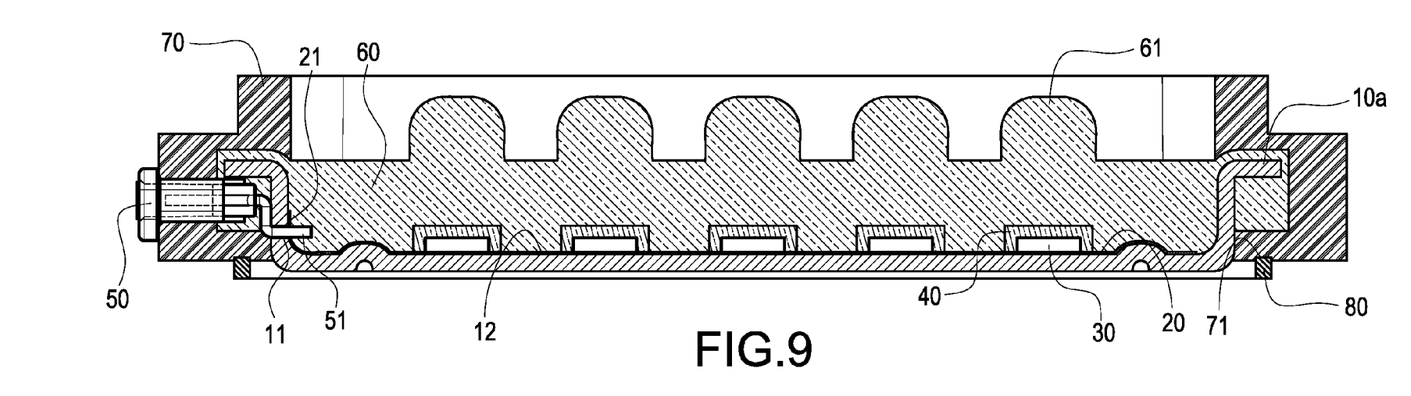
FIG. 9 is an assembled cross-sectional view showing the elements of FIG. 8 and a waterproof strip.

Moreover, the method of the present invention further includes a step S170 that can be performed after the step S160. In the step S170, a waterproof strip 80 is inserted into the lamp cover 70 to surround the outer periphery of the metallic substrate 10 (FIG. 9). In this step, one side of an annular waterproof strip 80 is fixed into the insertion slot 71 of the lamp cover 70, so that the waterproof strip 80 can surround the outer periphery of the three-dimensional casing 10a.

Figure 10:
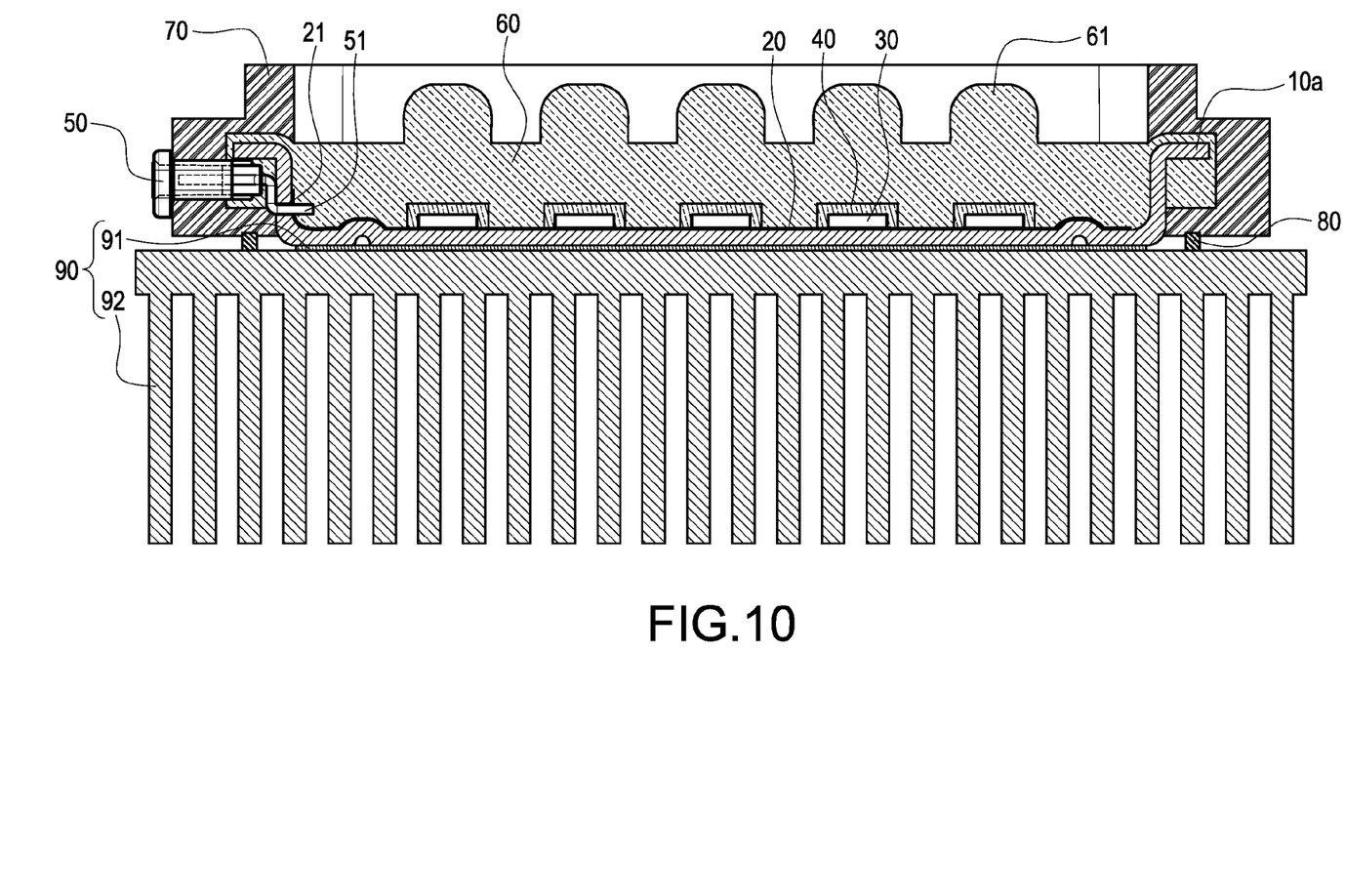
FIG. 10 is an assembled cross-sectional view showing the elements of FIG. 9 and a heat sink.

Moreover, the method of the present invention further includes a step S180 that can be performed after the step S170. In the step S180, a heat sink 90 is adhered to the metallic substrate 10 to press the waterproof strip 80 (FIG. 10). In this step, the heat sink 90 is constituted of a thermal-conducting layer 91 and a heat-dissipating body 92. The thermal-conducting layer 91 can be a metallic plate or thermal-conducting adhesive having good thermal conductivity, which is adhered to an outer surface of the three-dimensional casing 10a. The heat-dissipating body 92 is overlapped on the thermal-conducting layer 91 to press the waterproof strip 80.

Figure 11:
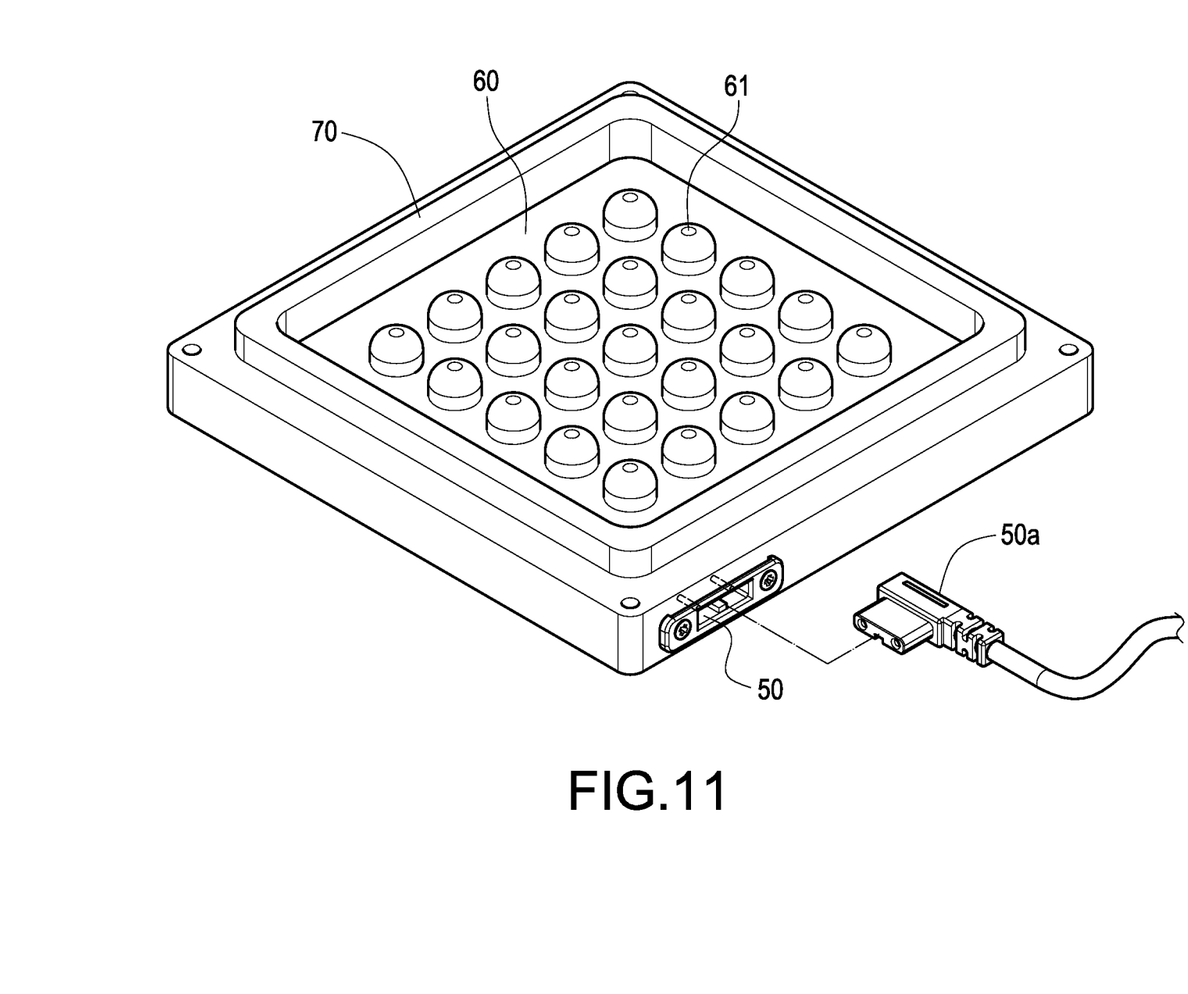
FIG. 11 is an exploded view showing the illuminating device of the present invention and a docking connector.
Figure 12:
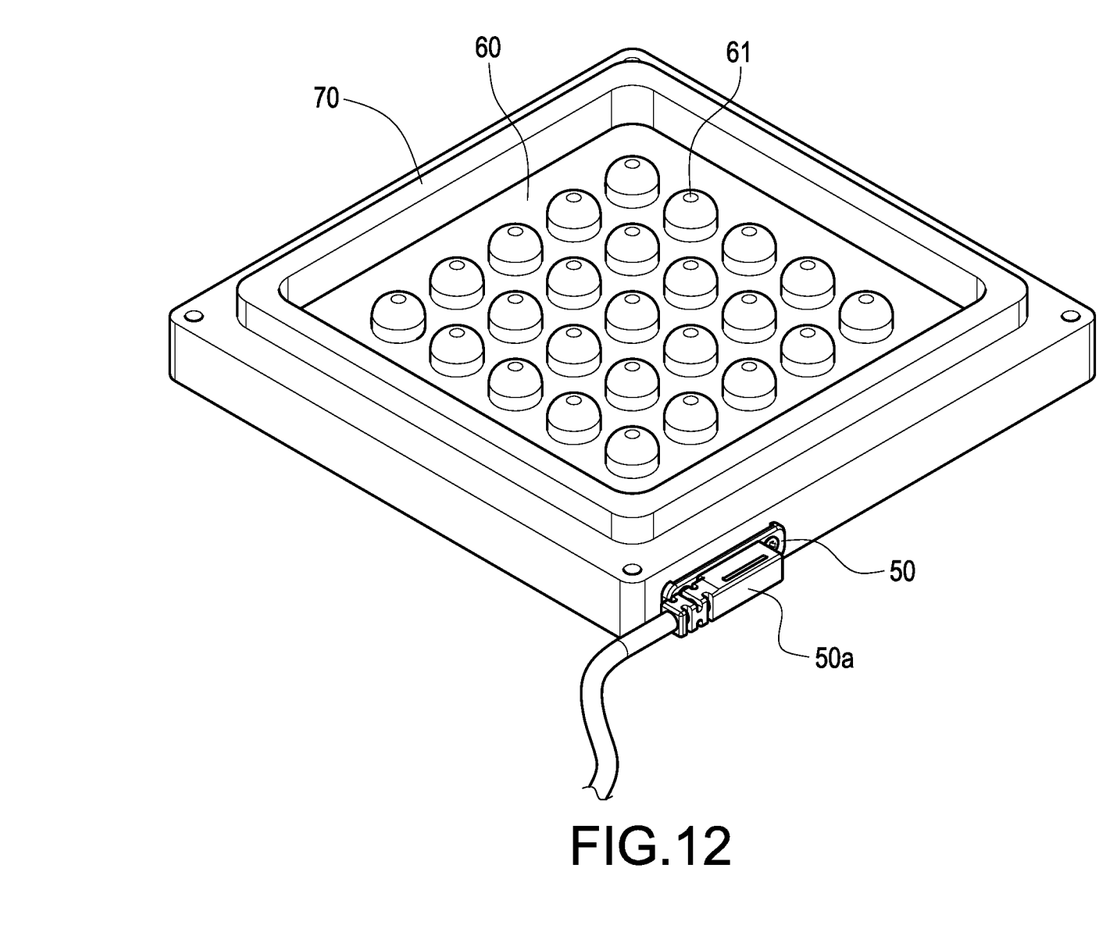
FIG. 12 is an assembled view showing the illuminating device of the present invention and a docking connector.

Please refer to FIGS. 11 and 12. According to the LED illuminating device of the present invention, the electrical connector 50 exposed to the outside of the lamp cover 70 can be used to connect with a docking connector 50a, thereby increasing its convenience in use.

Figure 13:
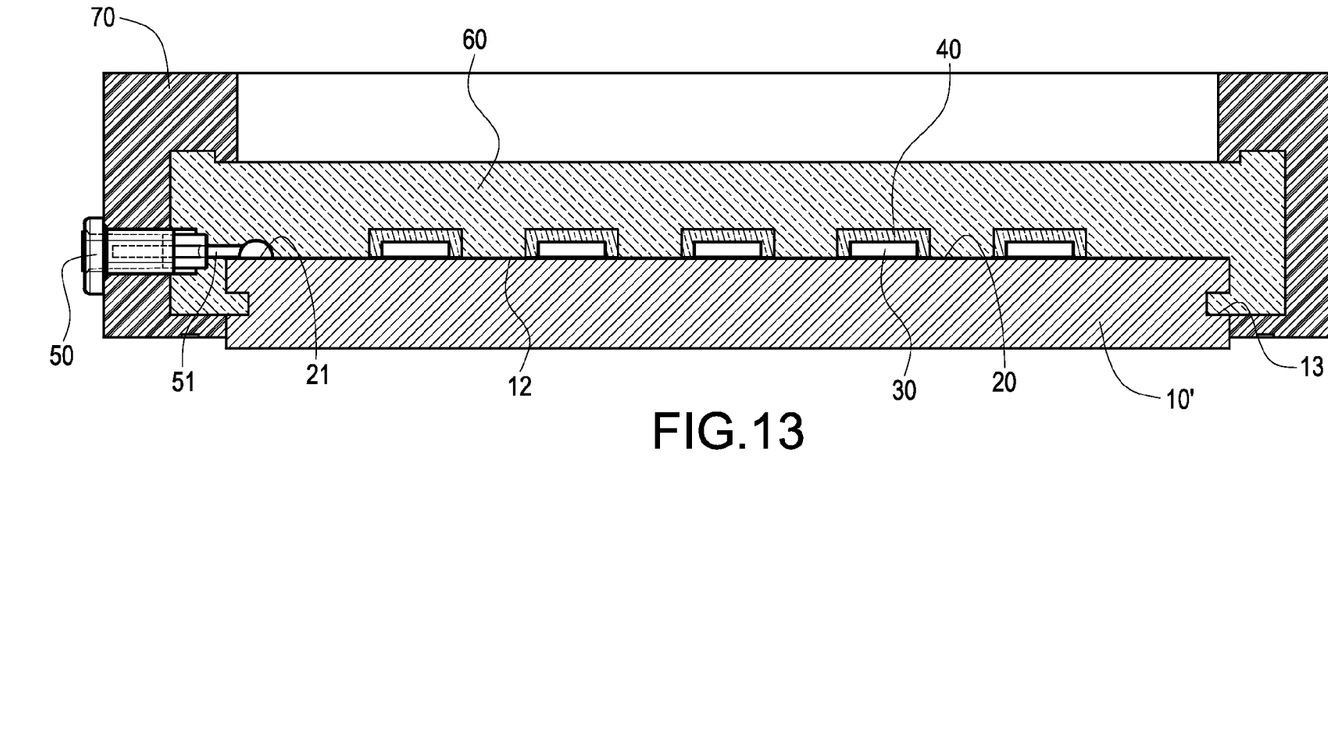
FIG. 13 is an assembled cross-sectional view showing another embodiment of the present invention.

Please refer to FIG. 13. In addition to the three-dimensional casing 10a of the previous embodiment, the metallic substrate 10 can be formed into a thickened metallic substrate 10' in the present embodiment. The side surface of the metallic substrate 10' is provided with an annular groove 13 in which the transparent body 60 can be inserted when the transparent body 60 is over-molded outside the electrical conductive circuit 20 and the electrical connector 50. In this way, the transparent body 60 and the metallic substrate 10' can be connected with each other tightly. Further, the upper surface of the transparent body 60 is a flat surface. The lamp cover 70 is over-molded outside the transparent body 60, the electrical connector 50 and a portion of metallic substrate 10'. With this structure, the present embodiment can achieve the same effect as that of the previous embodiment.

Figure 14:
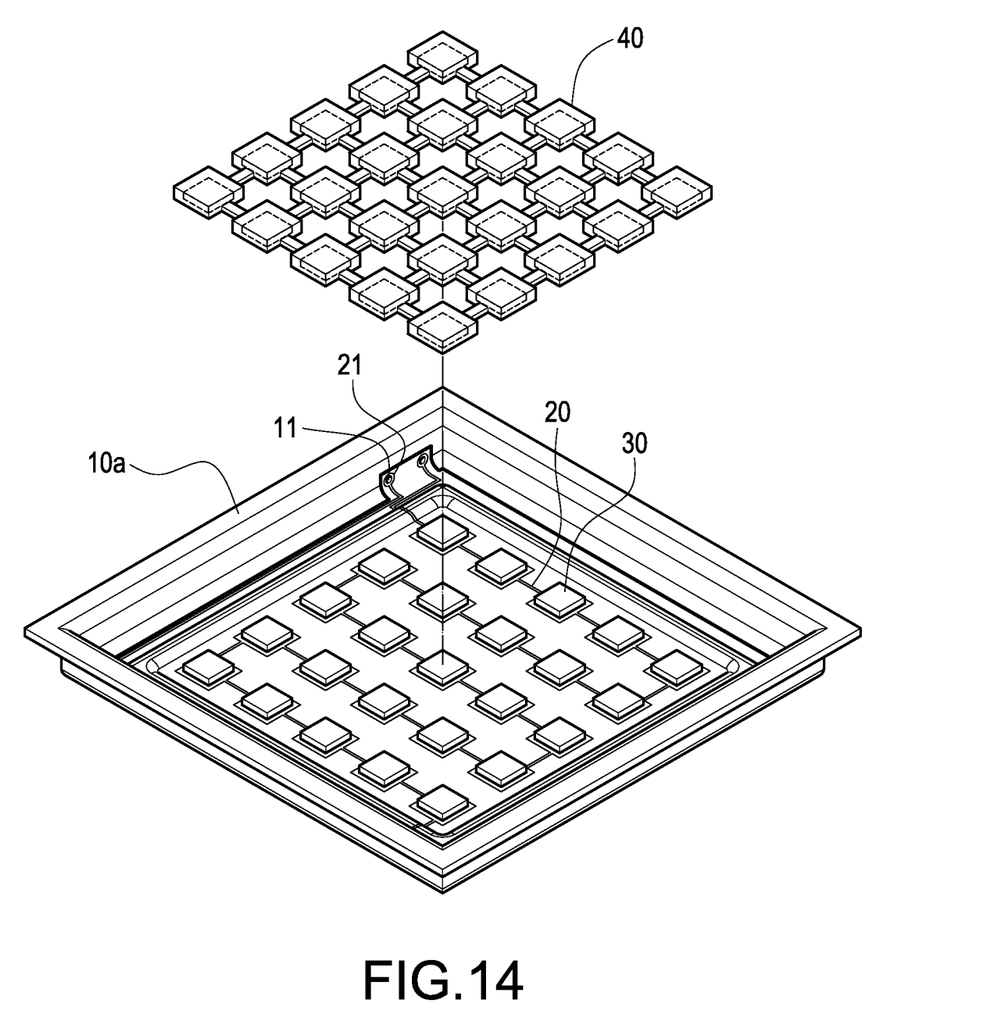
FIG. 14 is an exploded view showing a portion of elements of a further embodiment of the present invention.

Please refer to FIG. 14. In the previous embodiment, the transparent cap 40 is formed individually. Alternatively, an array of transparent caps 40 can be manufactured by an injection forming process to cover the respective light-emitting elements 30 of the three-dimensional casing 10a, thereby reducing the production time greatly.

According to the above, the illuminating device and the method for manufacturing the same according to the present invention really solves the problems of prior art and demonstrates novelty and inventive steps. Thus, the present invention conforms to the requirements for an invention patent.

What is claimed is:

1. An illuminating device, including:
   a molded casing formed by a metallic substrate, the casing having a bottom plate and a plurality of surrounding plates extending upwards from each side of the bottom plate;
   an electrical conductive circuit formed on an inner surface of the bottom plate in an insulating manner;
   a plurality of light-emitting elements arranged in matrix to be located on the bottom plate and electrically connected with the electrical conductive circuit;
   a plurality of transparent caps covering the light-emitting elements, respectively;
   a transparent body filled in the casing to cover on the electrical conductive circuit and the transparent caps, and over-molded outside the casing to partially cover on the surrounding plates, wherein a plurality of light-guiding posts are formed to be extended upwards from a surface of the transparent body, and each light-guiding post is located at a position corresponding to one corresponding transparent cap and the light-emitting element; and
   a lamp cover over-molded outside the casing from the surrounding plates.

2. The illuminating device according to claim 1, further including a waterproof strip, an outer surface of the lamp cover being formed with an insertion slot, the waterproof strip being inserted into the insertion slot to surround an outer periphery of the casing at the bottom plate.

3. The illuminating device according to claim 2, further including a heat sink, the heat sink being adhered to the casing so as to press the waterproof strip.

4. The illuminating device according to claim 3, wherein the heat sink comprises a thermal-conducting layer adhered to the casing and a heat-dissipating body adhered to the thermal-conducting layer to press the waterproof strip.

5. The illuminating device according to claim 1, wherein one of the surrounding plates is provided with two through-holes, and a pair of contacts of the electrical conductive circuit is provided to correspond to the two through-holes, respectively.

6. The illuminating device according to claim 1, further comprising an electrical connector fixed to the casing from outside of the surrounding plate, wherein a pair of electrical conductive rods of the electrical connector is inserted into the two through-holes and electrically connected with the electrical conductive circuit through the pair of contacts, respectively.

7. The illuminating device according to claim 6, wherein the electrical connector is a socket.

* * * * *